United States Patent
Gaw et al.

[11] Patent Number: 5,995,531
[45] Date of Patent: Nov. 30, 1999

[54] VCSEL HAVING POLARIZATION CONTROL AND METHOD OF MAKING SAME

[75] Inventors: Craig A. Gaw, Scottsdale; Wenbin Jiang, Phoenix; Benjamin W. Gable, Chandler, all of Ariz.

[73] Assignee: Motorola, Inc., Schaumburg, Ill.

[21] Appl. No.: 08/963,624

[22] Filed: Nov. 4, 1997

[51] Int. Cl.⁶ ............................. H01S 3/08; H01L 21/20
[52] U.S. Cl. ............................. 372/96; 372/43; 372/45; 372/46; 372/50; 372/92; 372/99; 372/106; 437/129
[58] Field of Search ................... 372/43, 45, 46, 372/50, 92, 96, 99, 106; 437/129

[56] References Cited

U.S. PATENT DOCUMENTS

| | | | |
|---|---|---|---|
| 5,331,654 | 7/1994 | Jewell et al. | 372/45 |
| 5,345,462 | 9/1994 | Choquette | 372/45 |
| 5,493,577 | 2/1996 | Choquette et al. | 372/45 |
| 5,625,636 | 4/1997 | Bryan et al. | 372/50 |
| 5,727,014 | 3/1998 | Wang et al. | 372/96 |
| 5,778,018 | 7/1998 | Yoshikawa et al. | 372/45 |

*Primary Examiner*—Brian Healy
*Attorney, Agent, or Firm*—Eugene A. Parsons; William E. Koch

[57] ABSTRACT

A vertical cavity surface emitting laser with polarization control includes a first stack of distributed Bragg reflectors positioned on a substrate with an active region including a first cladding region and a second cladding region positioned on opposite sides of an active area overlying the first stack of distributed Bragg reflectors A second stack of distributed Bragg reflectors is positioned on the active region. The second stack has an ion implantation region formed to control and define a lasing threshold of the laser. The second stack further is formed into a ridge with the ridge being etched into the ion implantation region to form an elongated shape so as to polarize light emitted by the second stack of distributed Bragg reflectors

14 Claims, 2 Drawing Sheets

5,995,531

VCSEL HAVING POLARIZATION CONTROL AND METHOD OF MAKING SAME

FIELD OF THE INVENTION

This invention relates, in general, to optical devices and, more particularly, to vertical cavity surface emitting lasers.

BACKGROUND OF THE INVENTION

Recently, there has been an increased interest in a new type of laser called a vertical cavity surface emitting laser (VCSEL). VCSELs have several advantages, such as being a smaller device, having potentially higher performance, and being potentially more manufacturable. These advantages are due in part from advances in epitaxial deposition techniques, such as metal organic vapor phase epitaxy (MOVPE) and molecular beam epitaxy (MBE).

However, even with these advances there are still several difficulties such as polarizing the light emitted from the VCSEL while obtaining low threshold current, and the like. In general, the high threshold current is, in part, caused by inefficient current confinement in the VCSEL. Thus, conventional VCSELs are not easily used in polarization sensitive applications.

It can be readily seen that conventional VCSELs have several disadvantages and problems. Thus, many advantages provided by VCSEL technology can not be taken full advantage of by designers and consumers. Moreover, since some of the applications are high volume applications, these problems do not allow VCSEL technology to be use so as to drive the cost of laser technology down. Therefore, a vertical cavity surface emitting laser and method of making same that provides light emission polarized toward a predetermined direction while lowering the threshold values and reducing cost would be highly desirable.

It is a purpose of the present invention to provide a new and improved vertical cavity surface emitting laser with polarization control.

It is another purpose of the present invention to provide a new and improved vertical cavity surface emitting laser with polarization control and low lasing threshold.

SUMMARY OF THE INVENTION

The above problems and others are at least partially solved and the above purposes and others are realized in a vertical cavity surface emitting laser with polarization control including a first stack of distributed Bragg reflectors positioned on a substrate with an active region including a first cladding region and a second cladding region positioned on opposite sides of an active area overlying the first stack of distributed Bragg reflectors. A second stack of distributed Bragg reflectors is positioned on the active region. The second stack has an ion implantation region formed to control and define a lasing threshold of the laser. The second stack is further formed into a ridge with the ridge being etched into the ion implantation region to form an elongated shape so as to polarize light emitted by the second stack of distributed Bragg reflectors.

BRIEF DESCRIPTION OF THE DRAWINGS

Referring to the drawings.

DESCRIPTION OF THE PREFERRED EMBODIMENT

Figure 1:
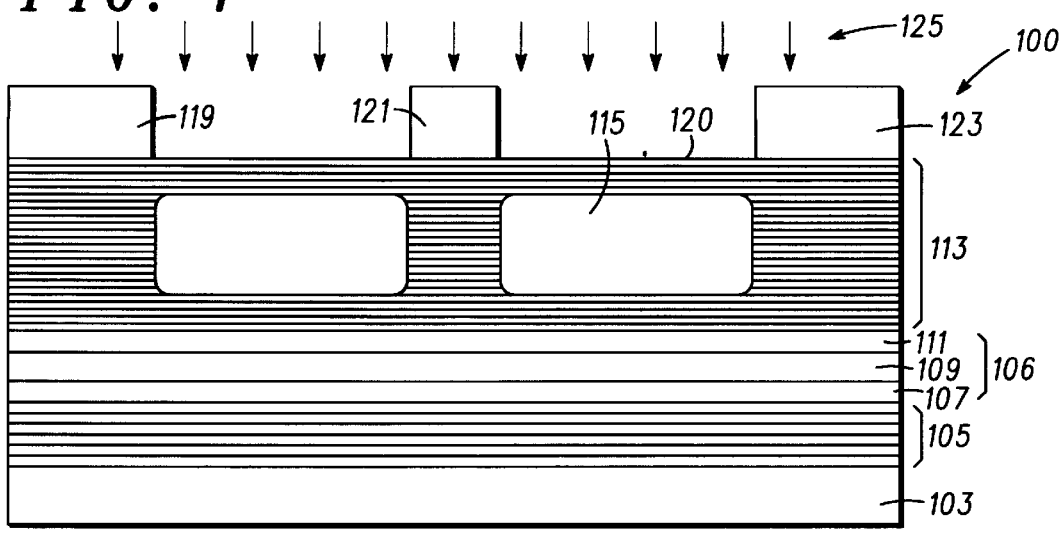
FIG. 1 is a sectional view of a partially fabricated VCSEL in accordance with the present invention, illustrating an ion implant.
Figure 2:
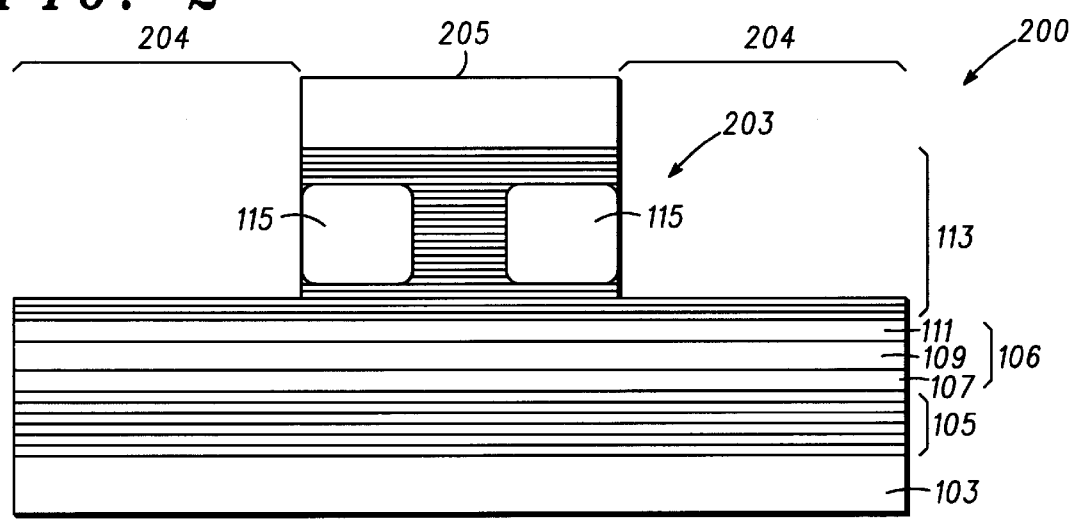
FIG. 2 is a sectional view of a partially fabricated VCSEL in accordance with the present invention, illustrating the partially fabricated VCSEL after etching.
Figure 3:
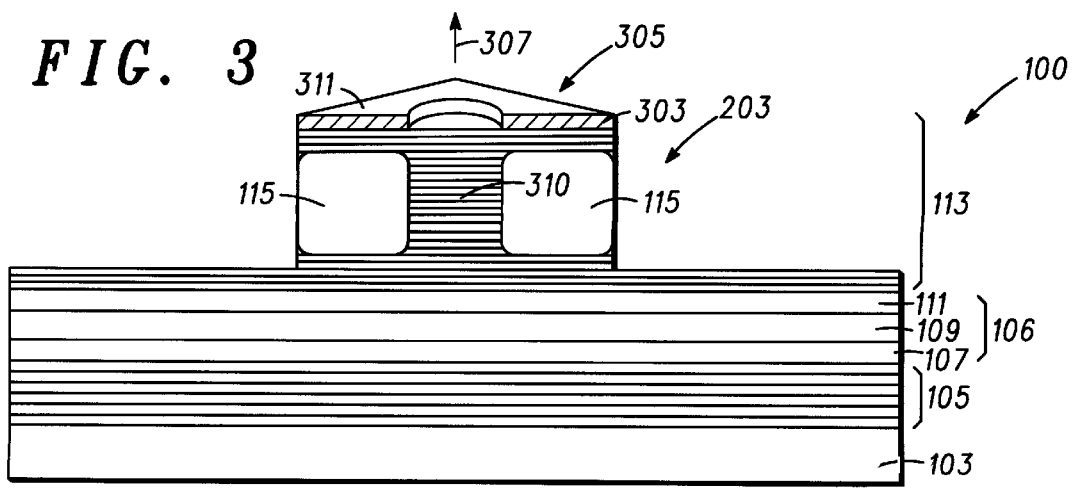
FIG. 3 is a sectional view of a VCSEL.

FIGS. 1–3 represent several sequential steps in the fabrication of a vertical cavity surface emitting laser (VCSEL) 300. As shown in FIGS. 1–3, partially fabricated VCSELs 100 and 200 and VCSEL 300 include several common elements, such as a substrate 103, a stack 105 of distributed Bragg reflectors, an active region 106 including, in this embodiment, a cladding region 107, an active area 109, a cladding region 111, and a stack 113 of distributed Bragg reflectors. Generally, substrate 103 is made of any suitable material, such as gallium arsenide, indium gallium arsenide; or the like on which subsequent layers can be grown or otherwise formed. Stacks 105 and 113 and active region 106 are made by any suitable epitaxial method, such as molecular beam epitaxy (MBE), metal-organic chemical vapor deposition (MOCVD), or the like.

For the sake of orienting the reader, a brief description of the materials and methods shall be presented hereinbelow. However, it will be understood by one of ordinary skill in the art, that a great many variations are possible and that these variations are considered part of the present invention.

Stacks 105 and 113 of distributed Bragg reflectors are made of any suitable alternating material layers capable of reflecting light emitted from active area 109. Typically, stacks 105 and 113 of distributed Bragg reflectors are made of aluminum gallium arsenide where the percent compositions of the elements are alternated, thereby yielding alternating material layers and alternating indexes of reflection. Typically, stacks 105 and 113 of distributed Bragg reflectors are either doped with a p-type dopant such as Beryllium (Be), Carbon (C), Zinc (Zn) or the like or doped with a n-type dopant such as Silicon (Si), Tin (Sn), selenium (Se) or the like. While stacks 105 and 113 of distributed Bragg reflectors can be either p-type or n-type doped, in this specific embodiment, stack 105 of distributed Bragg reflectors is n-type doped with Si at a dose ranging from 1e17 to 1e19 cm$^{-3}$, with a preferred range from 5e17 to 5e18 cm$^{-3}$, and a nominal dose of about 2e18 cm$^{-3}$. Stack 113 of distributed Bragg reflectors, in this specific embodiment, is p-type doped with C with a dose ranging from 1e17 to 1e9 cm , with a preferred range from 5e17 to 5e18 cm$^{-3}$, and a nominal dose of about 2e18 cm$^{-3}$.

Cladding regions 107 and 111 are made of any suitable material, such as gallium arsenide, aluminum gallium arsenide, indium gallium phosphide, indium aluminum gallium phosphide, and the like. Cladding region 107 is epitaxially disposed by any suitable method on stack 105 of distributed Bragg reflectors 105. Active area 109, generally having a plurality of quantum wells, is grown on cladding region 107 using any suitable method and any suitable materials. For example, active area 109 can be grown by any suitable epitaxial system, such as MBE, MOCVD and with materials, such as gallium arsenide, indium gallium phosphide, or the like. Cladding region 111 is grown on active area 109 by any suitable method and with any suitable materials similar to those used to form cladding region 107. It should be understood that active region 106 is described with an active area 109 disposed between cladding regions 107 and 111 for convenience and more or fewer layers might be included in any specific application.

Stack 113 of distributed Bragg reflector is epitaxially deposited on cladding region 111 using any suitable method and materials. For example, similar materials can be used to fabricate stack 113 of distributed Bragg reflectors as to form stack 105 of distributed Bragg reflectors. In the present process, once the epitaxial depositions of stacks 105 and 113 and active region 106 are completed, surface 120 is patterned with masking layers 119, 121, and 123 (FIG. 1), thereby providing covered or protected areas and providing uncovered or exposed areas of a surface 120. Masking layers 119, 121, and 123 are made of any suitable material or combination of materials, such as photoresist, oxide, nitride, or the like. Masking layers 119, 121, and 123 define a pattern having exposed areas and unexposed areas. Generally, the pattern formed by masking layers 119, 121, and 123 can be any suitable shape; however, in general, the shape is commonly donut, wherein a larger exposed area is provided and a smaller unexposed area is formed in the exposed area.

Ions, illustrated by arrows 125, are subsequently implanted into stack 113 of distributed Bragg reflectors to form implant region 115. It should be understood that FIG. 1 is a sectional view and extends into and out of the drawing, and that implant region 115 can be formed into any suitable shape, such as a donut shape, square shape, rectangular shape, triangular shape, or the like. Additionally, it should be understood that an inverse image is also formed, wherein ions, illustrated by arrows 125, are not implanted, thus forming an additional shape within the shape that implanted region 115 is formed into. By forming implant region 115 in stack 113 of distributed Bragg reflectors, current confinement within implant region 115 of partially fabricated VCSEL 100 is achieved.

The implantation of ions, illustrated by arrows 125, into stack 113 of distributed Bragg reflectors to form implant region 115 is achieved by implanting any suitable ion, such as protons ($H^+$) ions, oxygen ($O^-$) ions, or the like by any suitable method. It will be understood by those skilled in the art that implantation energies are dramatically different, for example, for protons and oxygen ions. Generally, the implantation energy is sufficient to ensure that the ion implantation reaches to an area 3–4 mirror pairs above cladding region 111 below p-type doped stack 113. Depending on the number of p-DBR mirror pairs in stack 113, the ion implantation energy and dose is different, but where the implantation ions should rest stays the same. Thus it will be understood by one of ordinary skill in the art that specific energies and dosages will depend on at least the type of ions used, the structure, and the specific application.

Referring more specifically to FIG. 2, partially fabricated VCSEL 200 is illustrated after being etched so as to form a ridge 203. It will be understood by one of ordinary skill in the art that several steps may have taken place between FIG. 1 and FIG. 2, such as cleaning, annealing, and the like. After completion of the ion implantation step, substrate 103 undergoes a patterning step by any suitable method, such as photolithography, or the like. Typically, a masking layer 205 is formed by any well known photolithographic process. Once the pattern has been defined, substrate 103 is etched by any well-known method in the art, such as plasma etching, wet etching, any combination of the two, or the like.

Briefly, masking layer 205 is made such that portions of stack 113 of distributed Bragg reflectors are exposed and portions of stack 113 of distribute Bragg reflectors are covered. By covering portions of stack 113 of distributed Bragg reflectors, the covered portions of stack 113 of distributed Bragg reflectors are protected from a subsequent etch process. Thus, allowing the etch process to remove portions of the exposed portions of stack 113 of distributed Bragg reflectors, thereby forming ridge 203 and isolation trench 204.

Masking layer 205 can be configured into any geometric pattern, such as an ellipse, a rhombus, a rectangle, an egg, or the like. Additionally, in a preferred embodiment of the present invention, the etched pattern fits into the pattern used to form implant region 115. For example, if the pattern formed by masking layers 119, 121, and 123 is a circle, then the pattern defined by masking layer 205 fits inside the circle pattern used to define the ion implantation mask. Once the pattern is formed by masking layer 205, etching of substrate 103 proceeds so that a portion of stack 113 of distributed Bragg reflector is removed. After the etching process is completed, masking layer 205 is removed by any well-known process in the art.

Referring to FIG. 3, a sectional view of VCSEL 300 having a contact layer or conductive region 303 with an emitting orifice or an opening 305 is illustrated. Once ridge 203 has been formed and masking layer 205 removed, contact layer 303 is formed on ridge 203 by any suitable method, such as deposition, photolithography, etching, or the like. As shown in FIG. 3, a portion 311 of contact layer 303 is shown to have either a square or rectangle shape. By forming ridge 203 in an elongated geometric pattern, light 307 emitted from orifice 305 is controlled and polarized in a predetermined manner. Thus, while the waveguide for VCSEL 300 is elliptically shaped to provide a desired polarization, the ion implantation of ion implantation region 115 limits current injection to an area 310 in stack 113 of distributed Bragg reflectors, thereby reducing the lasing threshold of VCSEL 300.

Figure 4:
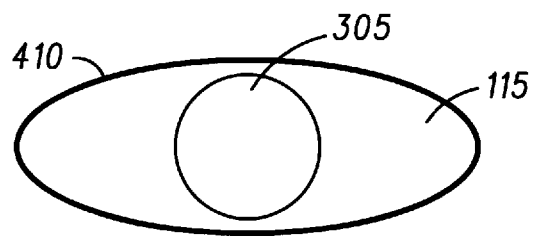
FIG. 4 is a top plan view of a VCSEL.

FIG. 4 is a top plan view of another embodiment of the present invention illustrating a VCSEL 400 with an implantation region 115 within an etched elongate mesa 410 and defining a circular emitting orifice 305. As shown in FIG. 4, relative positioning of implantation region 115 to etched elongated mesa 410 is such that etched elongated mesa 410 is within the ion implant region 115. With etched elongated mesa 410 controlling the polarization and implantation region 115 controlling and reducing the lasing threshold of VCSEL 400, a low threshold laser with a predetermined controlled polarization direction is fabricated at a reduced cost. Additionally, emitting orifice 305 can be formed into any suitable shape, such as a circle, a square, a rectangle, an ellipse, or the like. However, in a preferred embodiment of a the present invention, a circular opening is utilized.

Figure 5:
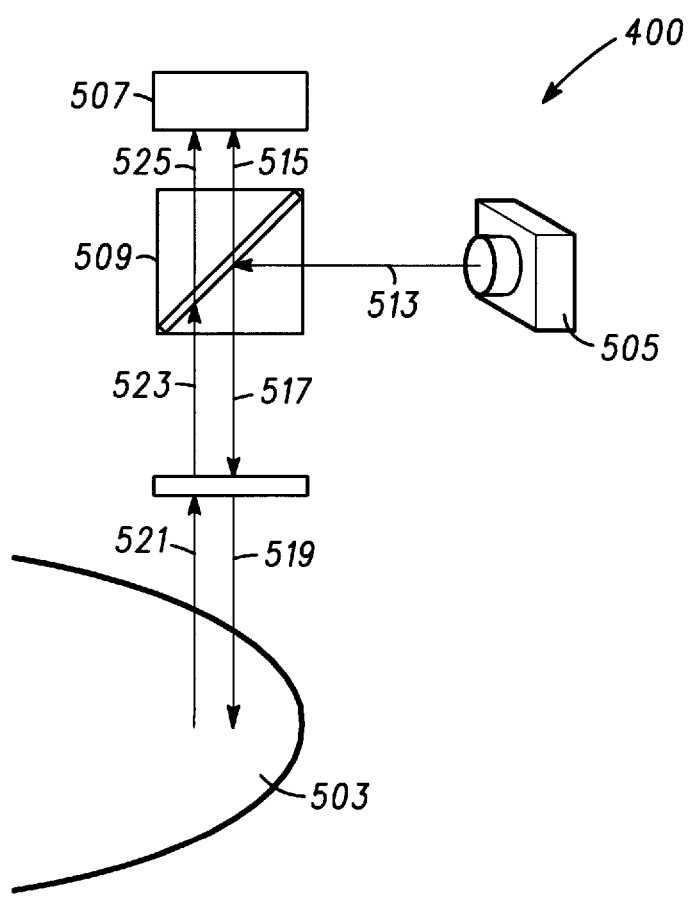
FIG. 5 is a diagrammatic illustration of an optical read/write head.

Referring now to FIG. 5, a schematic representation of an optical read/write head 500 in conjunction with an optical storage disk 503 is illustrated. Optical read/write head 500 includes a polarized VCSEL 505, which is similar to either VCSEL 300 or 400 described above, a detector 507, a polarizing beam splitter 509, and a quarter wave (¼λ) plate 511.

In operation, light, illustrated by arrow 513, emitted by polarized VCSEL 505 is directed toward polarizing beam splitter 509 where the light is directed by polarizing beam splitter 509 toward ¼ wave plate 511, as illustrated by arrow 517. Once the light passes through ¼ wave plate 511, the light, illustrated by arrow 519, is directed toward optical storage disk 503. Once the light strikes optical storage disk 503, it is reflected off of optical storage disk 503, illustrated by arrow 521, and redirected back through ¼ wave plate 511, illustrated by arrow 523, polarizing beam splitter 509, illustrated by arrow 525, and to detector 507. By detecting the variation of light reflected back from optical storage disk 503 using detector 507, data from optical storage disk 503 can be read and manipulated by any suitable electronics.

By using polarized VCSEL 505, several advantages can be realized, such as a reduced power requirement from the VCSEL since no power is wasted by the polarizing beam splitter, a reduced laser beam feeding back into the laser itself that may destabilize the laser operation, and the capability of reading an MO disk that requires a polarized beam. In addition, VCSELs that have circular shaped beam can be more efficiently utilized than edge emitting lasers. Also, the low threshold current of the VCSEL reduces the total electrical power consumption. Thus, by making use of polarized VCSEL 505, several advantages are realized and it is readily useable for portable and mobile applications.

By now it should be appreciated that a novel article and method of making have been provided. Polarization of a polarized VCSEL is now controlled and manufacturable, thereby enabling application of polarized VCSEL's in a great many fields. Additionally, since polarized VCSEL's are highly manufacturable, VCSEL's are readily applicable in high volume applications, thus reducing cost and allowing significant improvement in reliability and quality.

While we have shown and described specific embodiments of the present invention, further modification and improvement will occur to those skilled in the art. We desire it to be understood, therefore, that this invention is not limited to the particular forms shown and we intend in the appended claims to cover all modifications that do not depart from the spirit and scope of this invention.

What is claimed is:

1. A vertical cavity surface emitting laser having polarization control comprising:

a first stack of distributed Bragg reflectors;

an active region positioned adjacent the first stack of distributed Bragg reflectors; and a second stack of distributed Bragg reflectors positioned adjacent the active region so as to align the first and second stacks with the active region sandwiched therebetween, the second stack having an ion implantation region and formed in the shape of an elongated ridge having a dumbbell-like cross section so as to provide a desired polarization to light output from the second stack.

2. A vertical cavity surface emitting laser having polarization control as claimed in claim 1 wherein the elongated ridge has a rectangular cross-section.

3. A vertical cavity surface emitting laser having polarization control as claimed in claim 1 wherein the elongated ridge has an elliptical cross-section.

4. A vertical cavity surface emitting laser having polarization control as claimed in claim 1 wherein the elongated ridge has a rhomboidal cross-section.

5. A vertical cavity surface emitting laser having polarization control as claimed in claim 1 further including a conductive layer overlying the second stack of distributed Bragg reflectors, the conductive layer having an aperture with a shape for light to be emitted from.

6. A vertical cavity surface emitting laser having polarization control as claimed in claim 5 wherein the shape of the aperture is a circle.

7. A vertical cavity surface emitting laser having polarization control as claimed in claim 5 wherein the shape of the aperture is a square.

8. A vertical cavity surface emitting laser having polarization control comprising:

a substrate having a first surface;

a first stack of distributed Bragg reflectors overlying the substrate;

an active region including a first cladding region and a second cladding region positioned on opposite sides of an active area, the active region overlying the first stack of distributed Bragg reflectors; and a second stack of distributed Bragg reflectors overlying the active region, the second stack having an ion implantation region with a dose formed to control and define a lasing threshold of the laser, and the second stack further being formed into a ridge, the ridge being etched into the ion implantation region to form an elongated shape having a dumbbell-like cross section so as to polarize light emitted by the second stack of distributed Bragg reflectors.

9. A vertical cavity surface emitting laser having polarization control as claimed in claim 8 further including a conductive layer overlying the second stack of distributed Bragg reflectors, the conductive layer having an aperture with a shape for light to be emitted from.

10. A vertical cavity surface emitting laser having polarization control as claimed in claim 9 wherein the shape of the aperture is a circle.

11. A vertical cavity surface emitting laser having polarization control as claimed in claim 9 wherein the shape of the aperture is a square.

12. A vertical cavity surface emitting laser having polarization control as claimed in claim 8 wherein the ion implantation region is implanted with protons.

13. A vertical cavity surface emitting laser having polarization control as claimed in claim 12 wherein the implantation region extends into a portion of the second stack of distributed Bragg reflectors.

14. A method for making a vertical cavity surface emitting laser having a polarization control including the steps of:

providing a substrate having a first surface;

disposing a first stack of distributed Bragg reflectors overlying the substrate;

disposing an active region adjacent the first cladding region;

disposing a second stack of distributed Bragg reflectors adjacent the active region so the first and second stacks of distributed Bragg reflectors are aligned with the active region sandwiched therebetween, the second stack of distributed Bragg reflectors having an ion implantation region with a dose formed to control and define a lasing threshold of the laser, and the second stack of distributed Bragg reflectors further being formed in shape of an elongated ridge, the ridge being etched into the ion implantation region to form an elongated shape having a dumbbell-like cross section so as to polarize light emitted by the second stack of distributed Bragg reflectors.

* * * * *